United States Patent
McLachlan et al.

(10) Patent No.: US 8,154,433 B2
(45) Date of Patent: Apr. 10, 2012

(54) LINEARITY CORRECTION CIRCUIT FOR VOLTAGE MODE DAC

(75) Inventors: Roderick McLachlan, Edinburgh (GB); Teng-Hee Lee, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 56 days.

(21) Appl. No.: 12/899,660

(22) Filed: Oct. 7, 2010

(65) Prior Publication Data

US 2012/0050080 A1 Mar. 1, 2012

Related U.S. Application Data

(60) Provisional application No. 61/377,734, filed on Aug. 27, 2010.

(51) Int. Cl.
*H03M 1/10* (2006.01)

(52) U.S. Cl. .................................. 341/120; 341/144
(58) Field of Classification Search .................. 341/120, 341/144, 118; 330/257
See application file for complete search history.

(56) References Cited

U.S. PATENT DOCUMENTS

| | | | |
|---|---|---|---|
| 6,414,615 B1 * | 7/2002 | Cheng | 341/143 |
| 7,471,151 B2 * | 12/2008 | Kan | 330/264 |
| 7,541,871 B2 * | 6/2009 | Willassen et al. | 330/257 |
| 2010/0315277 A1 | 12/2010 | McLachlan et al. | |

* cited by examiner

*Primary Examiner* — Peguy Jean Pierre
(74) *Attorney, Agent, or Firm* — Kenyon & Kenyon LLP

(57) ABSTRACT

A force/sense voltage-mode DAC coupled with multiple transconductance amplifiers that generate a correction current injected to a node in one of the DAC cells is discussed. The correction current injected into the DAC cell may reduce nonlinearity produced by biasing current to the operational amplifiers in the DAC.

56 Claims, 7 Drawing Sheets

LINEARITY CORRECTION CIRCUIT FOR VOLTAGE MODE DAC

CROSS-REFERENCE TO RELATED APPLICATIONS

This application claims priority to U.S. Provisional Patent Application No. 61/377,734, filed on Aug. 27, 2010, entitled "Linearity Correction Circuit for Voltage Mode DAC," which is herein incorporated by reference in its entirety.

FIELD OF THE INVENTION

The present invention relates to digital-to-analog converters (DACs) that have separate force and sense switches for each switchable resistor within the DAC. The present invention further relates to a base-current correction circuit that corrects nonlinearity resulting from biasing force/sense DACs.

BACKGROUND OF INVENTION

An integrated voltage-mode digital to analog converter ("DAC") consists of a network of resistors and switches. One node of the network is the output voltage and another two nodes are reference voltages. The analog output voltage is a voltage that lies somewhere between the two reference voltages as determined by a digital input code. Common designs for high accuracy voltage-mode DACs include binary weighted R2R architectures, segmented architectures that include equally weighted segments, and hybrids between the equally segmented architecture and the R2R architecture. Although these designs vary in architecture, each design provides a plurality of switchable cells that are activated based on the digital code input to the DAC. The activated cells contribute to an analog voltage generated at the DACs output. Each cell's contribution is determined, at least, in part based on the resistance of the cell itself and any coupling resistance that extends between the cell and the output terminal. Switches used in these DAC may typically be CMOS devices. The selection of CMOS devices may not be ideal however, because the CMOS devices may contain its own resistance which has an associated nonlinearity.

Moreover, the resistance associated with these CMOS switches varies according to the voltage they operate at and, since there are switches coupled to two different reference voltages, it can reasonably be expected that these will have different resistances at different switch settings. Although some attempts have been made to equalize these switch resistances to minimize this source of nonlinearity error, generally some residual error persists due to the accuracy of the method itself. Conventionally, to provide a voltage-mode DAC that is very accurate, circuit designers have opted to use large CMOS switches. Larger switches generally have a lower switch resistance, which may decrease nonlinearity error, but have the at the cost of requiring a much larger silicon area and added cost. Thus, there appears to be a need for a voltage-mode DAC design that uses smaller and more cost-effective switches. However, such a design alone may not overcome nonlinearity errors.

FIG. 1 illustrates a force/sense voltage-mode DAC as described in application Ser. No. 12/483,295. DAC 100 is an equally-weighted segmented ladder structure and is comprised of two operational amplifiers, 110 and 120 coupled to $V_{HI}$ and $V_{LO}$ at the non-inverting input. Each of the op amps 110, 120 is connected to a plurality of switch-controlled cells 130.1-130.N. For a DAC of bit width W, there would be N=2$^W$ cells. When activated, each cell 130.1-130.N contributes equally to a voltage at the voltage output.

Each cell 130.1-130.N contains two pairs of force and sense switches that are alternately closed, with one pair corresponding to nMOS devices and the other pMOS devices. Each of the switches are coupled to a resistor 140.1-140.N in the cell. The force switches ($R_{pf}$ and $R_{nf}$) provide selectively conductive paths to permit either op amp to drive a given cell. When an op amp drives a particular cell, a sense switch ($R_{ps}$ and $R_{ns}$) connected to that op amp generates a feedback path to the driving op amp.

Switching occurs between the various resistor nodes and either a high or a low reference voltage. Ideally, the voltage at the output of the voltage-mode DAC should be equal to:

$$V_{OUT} = V_{LO} + \frac{D}{N}(V_{HI} - V_{LO}), \qquad (i)$$

where N is the total number of cells or resistor nodes, D is the input code, $V_{HI}$ is the high reference voltage, and $V_{LO}$ is the low reference voltage.

However, while the design of the force/sense voltage-mode DAC allows for rectifying the nonlinearity between MOSFET devices and the precision resistors, the DAC creates an additional nonlinearity error. In particular, a feedback path from the sense switches to the operational amplifiers introduces an additional source of nonlinearity, as a reference operational amplifier that has a non-zero input bias current introduces nonlinearity to the output of the DAC resulting in a voltage error at the output.

The voltage errors do not exist, however, at extreme values of the input code D (e.g., D is the minimum (zero) or maximum values). Therefore, the voltage error is not independent of the input code D. At D=0, all the cells are switched to the low reference voltage ("$V_{LO}$") and there is no bias current $I_{bp}$ from $R_{ps}$ fed back to op amp 110. The contributing error at this state from sense switches $R_{NS}$, is:

$$Verr_n = \frac{I_{bn} R_{ns}}{N - D}, \qquad (ii)$$

where $I_{bn}$ is the biasing current to op amp 120 and $R_{NS}$ is the equivalent resistance of the nMOS sense switch.

At D=N, all the cells are switched to the high reference voltage and $I_{bn}$=0 and does not contribute to the error at the output. The error at the output from $I_{bp}$ is:

$$Verr_p = \frac{I_{bp} R_{ps}}{D}, \qquad (iii)$$

where $I_{bp}$ is the biasing current to op amp 110, and $R_{PS}$ is the resistance of the pMOS sense switch.

If D is between the minimum and maximum values (0<D<N), both $I_{bp}$ and $I_{bn}$ contribute to the error at the output. The corresponding voltage error at the output for all input codes is equal to:

$$\frac{I_{bn} R_{ns}}{N}, D = 0 \qquad (iv)$$

-continued $$V_{err} = \frac{I_{bp}R_{ps}}{N} + \frac{I_{bn}R_{ns}}{N}, 0 < D < N$$

$$\frac{I_{bp}R_{ps}}{N}, D = N$$

As shown from equation (iv), the contribution to the voltage error at the output by $I_{bp}$ and $I_{bn}$ varies dependent on the interval of operation. Thus there is a need in the art, for a force/sense voltage-mode DAC that reduces nonlinearity that results from op amp input bias current from the sense switches in the DAC, by maintaining a constant error contribution at the output.

DETAILED DESCRIPTION

Embodiments of the present invention provide a digital to analog converter with high accuracy. The DAC may contain a plurality of cells that include at least one resistor and multiple force switches and sense switches to selectively connect the resistor to operational amplifiers ("op amps") providing respective high and low reference voltages to the circuit. The circuit further may include a transconductance amplifier, one provided for each op amp, that introduces a correction current into a DAC cell and counteracts the bias currents that otherwise cause non-linear behavior in the DAC's output, by creating a constant error contribution out the output.

Figure 1:
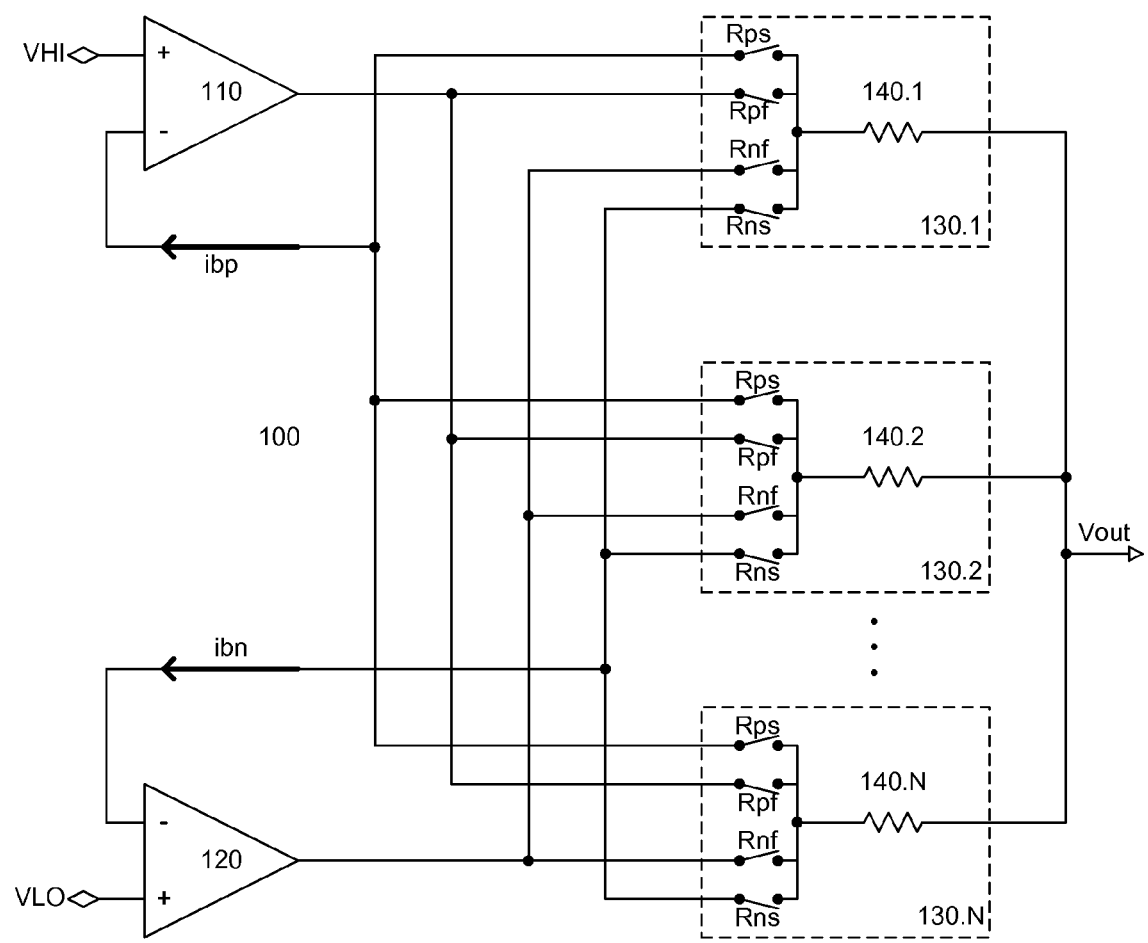
FIG. 1 is a diagram of a segmented force/sense voltage-mode DAC.
Figure 2:
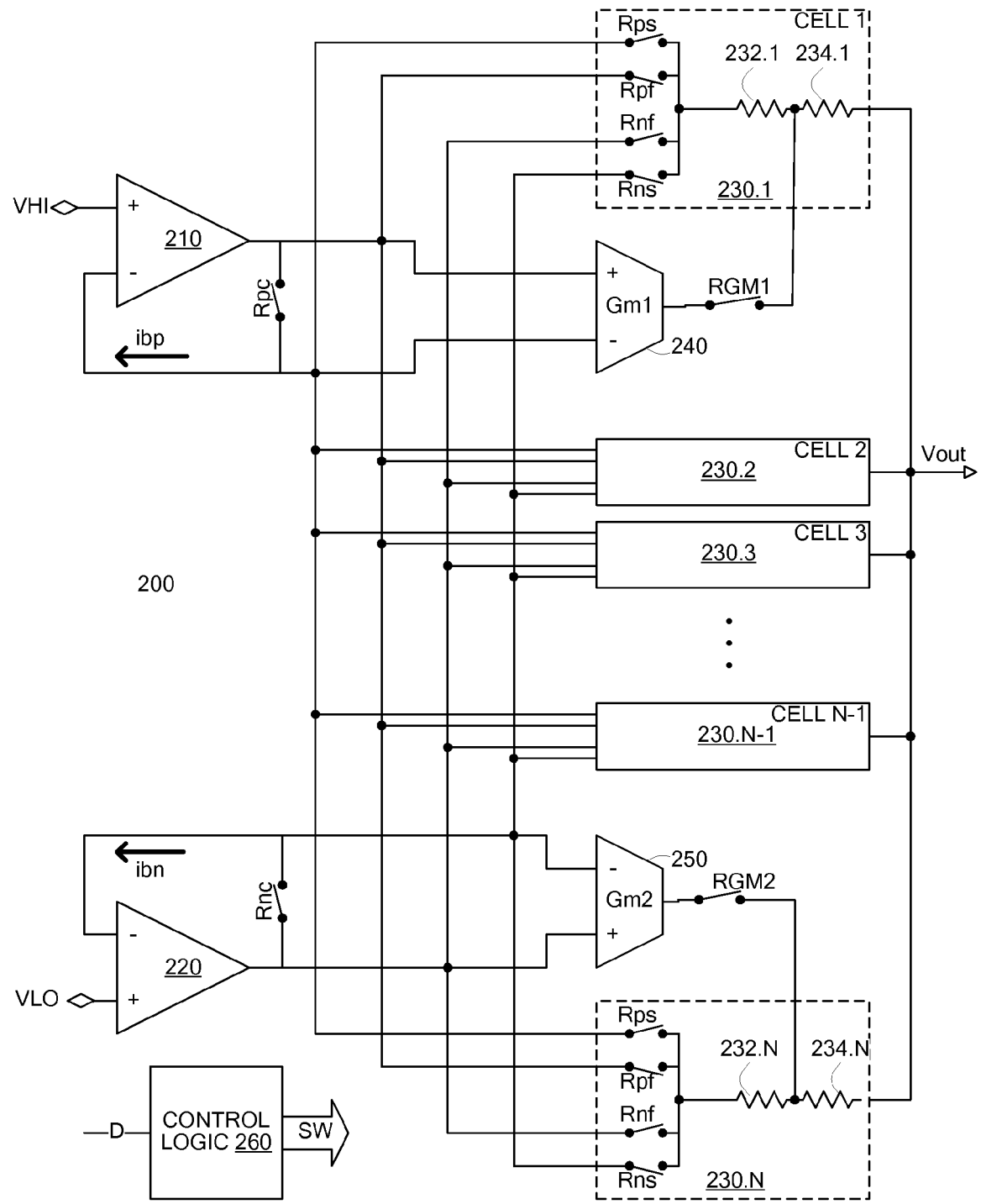
FIG. 2 is a diagram of a segmented force/sense voltage-mode DAC with a transconductance amplifier to generate a correction current.

FIG. 2 illustrates a DAC 200 according to an embodiment of the present invention. The DAC 200 may include a pair of op amps 210, 220, a plurality of resistive cells 230.1-230.N and a pair of transconductance amplifiers 240, 250. Although the DAC 200 illustrated in FIG. 2 is shown as a segmented DAC, the principles of the present invention find application with other DAC architectures, such as the binary weighted R2R DAC architecture and hybrid architectures.

Individual cells may include a resistive element, shown as respective pairs of resistors 232.1, 234.1 (for cell 230.1) and two pairs of force and sense switches. These switches each have their own impedance which is represented by the labels, $R_{ps}$, $R_{pf}$, $R_{ns}$, $R_{nf}$. In the embodiment of FIG. 2, all cells 230.1-230.N have a common architecture and, for ease of illustration, cells 2 through N−1 are not shown in detail. The op amps 210, 220 each may have an input coupled to a respective reference voltage ($V_{HI}$ or $V_{LO}$) and an output coupled to respective force switches ($R_{pf}$ or $R_{nf}$) of each cell 230.1-230.N. The DAC 200 further may include control logic 260 that, responsive to an input code word D, control activation of the various switches of the DAC. Individual connections between the switches and the control logic 260 are not shown, again for ease of illustration.

The first transconductance amplifier 240 may be coupled at a non-inverting input to the output of the first op amp 210. Its inverting input may be coupled to an inverting input of the first op amp 210 and also to the $R_{ps}$ sense switches of the cells 230.1-230.N. The first transconductance amplifier 240 may generate an output current that is based on a voltage difference established between the first op amp's output and the op amp's inverting input. An output of the first transconductance amplifier 240 may be input to a selected cell of the DAC 200 (cell 230.1 in the illustrated embodiment) when switch $R_{GM1}$ is closed. Switch $R_{GM1}$ may selectably connect and disconnect transconductance amplifier 240 from the selected cell.

The second transconductance amplifier 250 may be coupled at a non-inverting input to the output of the second op amp 220. Its inverting input may be coupled to an inverting input of the second op amp 220 and also to the $R_{ns}$ sense switches of the cells 230.1-230.N. The second transconductance amplifier 250 may generate an output current that is based on a voltage difference established between the second op amp's output and the op amp's inverting input. An output of the second transconductance amplifier 250 may be input to a selected cell of the DAC 200 (cell 230.N in the illustrated embodiment) when switch $R_{GM2}$ is closed. Switch $R_{GM2}$ may selectably connect and disconnect transconductance amplifier 250 from the selected cell. Any resistance value of $R_{GM1}$ and $R_{GM2}$ may be ignored because the switches are in series with the transconductance, which has an infinite output resistance.

The transconductance amplifiers 240, 250 may generate current outputs that counteract the $I_{bp}$ and $I_{bn}$ terms of equation (iv) above. Specifically, the transconductance amplifiers may generate a current $L_{out}$ having the form $I_{out} = \Delta V * Gm$, where $\Delta V$ represents a voltage across the inputs of the respective amplifier 240 or 250 and Gm is a gain factor. Each $\Delta V$ may be generated by $I_{bp}$ and $I_{bn}$ multiplied by $R_{pc}$ or $R_{nc}$ respectively, and the respective $\Delta V$ may be deliberated generated by $R_{pc}$ or $R_{nc}$ when the associated opamp 210 or 220 is not switched via cells 230.1-230.N to the output node. In practice the gain factor Gm may be set to be inversely proportional to the resistance of a DAC resistor 232.1, 234,1, and may be represented by the equation:

$$Gm = \frac{1}{K * R_{DAC}}, \quad (v)$$

where K is a correction factor chosen by a designer.

During operation, in response to an input code word D, the control logic 260 may control switches of the cells to generate a proper output voltage on the $V_{out}$ terminal. When $0<D<N$, sense/force switches of at least one cell will couple the first op amp 210 to the $V_{out}$ terminal and sense/force switches of at least one other cell will couple the second op amp 220 to the $V_{out}$ terminal. In such a case, the control logic 260 will ensure that the cell to which the first transconductance amplifier 240 is coupled (cell 230.1 in the illustrated embodiment) will be connected to the first op amp 210 via the $R_{ps}$, $R_{pf}$ switches of that cell. Similarly, the control logic may couple the cell to which the second transconductance amplifier 250 is coupled (cell 230.N in the illustrated embodiment), to the second op amp 220 via the $R_{ns}$, $R_{nf}$ switches of that cell. During this interval both $I_{bp}$ and $I_{bn}$ may contribute to an error at the output.

In an embodiment, the DAC 200 also may include coupling switches $R_{pc}$, $R_{nc}$, which may be represented by their impedance, provided for each of the op amps 210, 220 coupling the op amp's output to its inverting input. The switch $R_{pc}$ may be set to $M*R_{ps}$, whereas the switch $R_{nc}$ may be set to $M*R_{ns}$, where M represents a switch resistance multiplier. These switches may be engaged based on the value of D. When D=0, for example, the control logic 260 will connect all cells 230.1-230.N of the DAC 200 to the output of the second op amp 220. In this event, the control logic 260 may cause switch $R_{pc}$ to close, connecting the first op amp's output terminal to its inverting input. Closing $R_{pc}$ may generate a differential voltage across the inputs of transconductance amplifier 240 that is proportional to $I_{bp}$ and $R_{pc}$ (or $R_{ps}$). Switch $R_{GM1}$ may close and transconductance amplifier 240 may output a current to a selected cell (cell 230.1 in the illustrated embodiment). The output current may assure that the contribution to the voltage error at the output by $I_{bp}$ is constant even when D=0.

Similarly, when D=N, the control logic 260 will connect all cells 230.1-230.N of the DAC 200 to the output of the first op amp 210. In this event, the control logic 260 may cause switch $R_{nc}$ to close, connecting the second op amp's output terminal to its inverting input. Closing $R_{nc}$ may generate a differential voltage across the inputs of transconductance amplifier 250 that is proportional to $I_{bn}$ and $R_{nc}$ (or $R_{ns}$). Switch $R_{GM2}$ may close and transconductance amplifier 250 may output a current to a selected cell (cell 230.N in the illustrated embodiment). The output current may assure that the contribution to the voltage error at the output by $I_{bn}$ is constant even when D=N. The output current may be injected into the same cell or different cells (as depicted in FIG. 2).

An input offset voltage may be provided to reset the output of transconductance amplifiers 240 and 250 to zero when no correction current is to be generated. Transconductance amplifiers 240 and 250 may be sensitive to an input offset voltage, therefore the circuit may short the inputs of the transconductance amplifiers together when no output current is needed. An alternate embodiment is depicted in FIG. 3.

Figure 3:
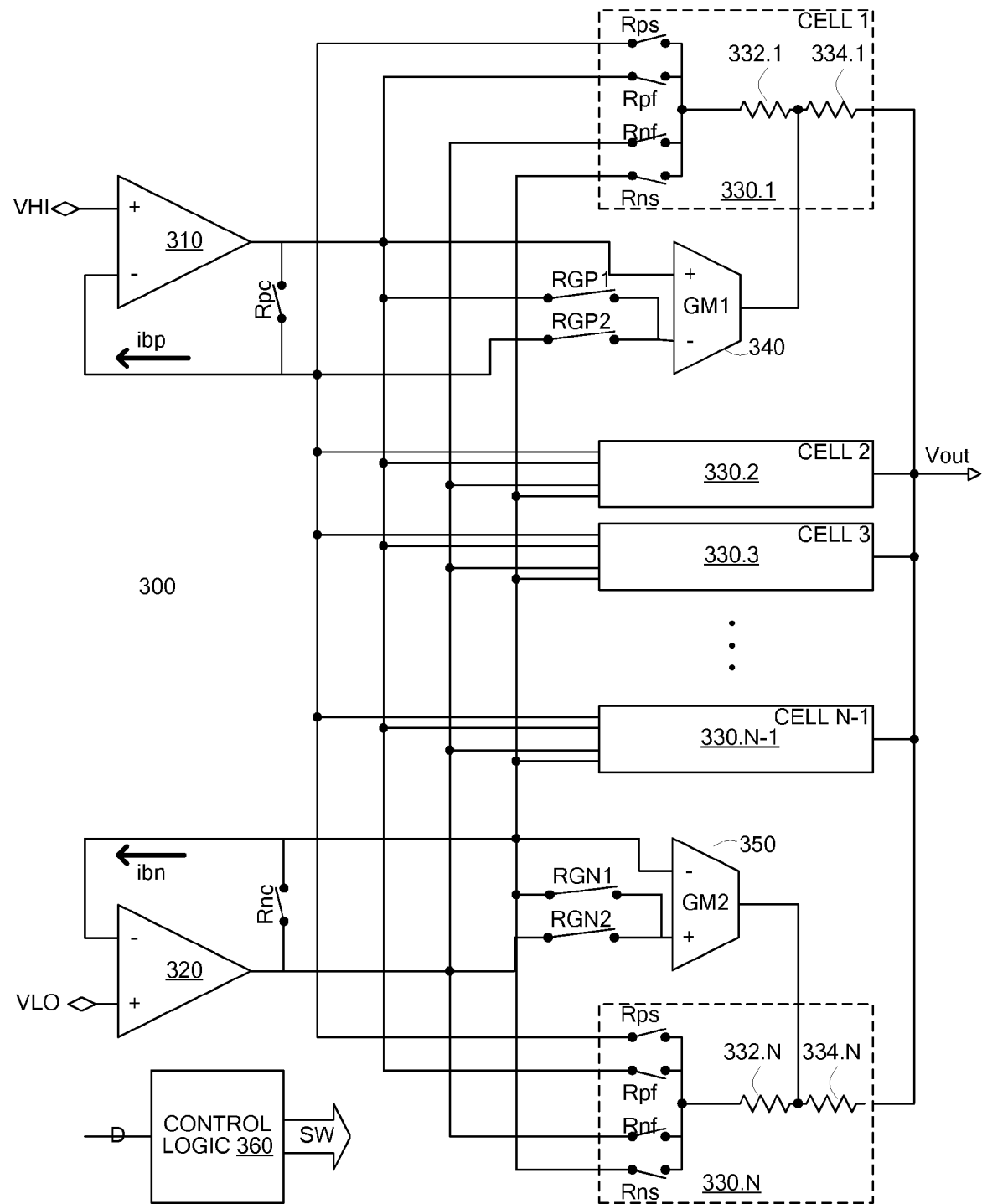
FIG. 3 is a diagram of a segmented force/sense voltage-mode DAC with a transconductance amplifier immune to a voltage offset.

FIG. 3 illustrates a DAC 300 according to an alternative embodiment of the present invention. DAC 300 may include a pair of op amps 310, 320, a plurality of resistive cells 330.1-330.N and a pair of transconductance amplifiers 340, 350 that may be continually connected to the DAC. DAC 300 may be an equally weighted DAC as depicted in FIG. 3, although other architecture such as the binary weighted R2R DAC architecture and hybrid architectures may be used.

Individual cells may include a resistive element, shown as respective pairs of resistors 332.1, 334.1 (for cell 330.1) and two pairs of force and sense switches. These switches each have their own impedance which is represented by the labels, $R_{ps}$, $R_{pf}$, $R_{ns}$, $R_{nf}$. The op amps 310, 320 each may have an input coupled to a respective reference voltage ($V_{HI}$ or $V_{LO}$) and an output coupled to respective force switches ($R_{pf}$ or $R_{nf}$) of each cell 330.1-330.N. The DAC 300 further may include control logic 360 that, responsive to an input code word D, control activation of the various switches of the DAC.

The first transconductance amplifier 340 may be coupled at a non-inverting input to the output of the first op amp 310. Its inverting input may be alternately coupled to the output of first op amp 310 through switch $R_{GP1}$ or to the inverting input of the first op amp 310 and the $R_{ps}$ sense switches of the cells 330.1-330.N through switch $R_{GP2}$ when D=0 and $R_{GP2}$ and $R_{pc}$ are closed. In contrast to transconductance amplifier 240, transconductance amplifier 340 may be continually connected to the selected cell in the DAC at its output. The first transconductance amplifier 340 may generate an output current that is based on a voltage difference established between the first op amp's output and the op amp's inverting input. An output of the first transconductance amplifier 340 may be input to a selected cell of the DAC 300 (cell 330.1 in the illustrated embodiment) when switches $R_{GP2}$ is closed and $R_{GP1}$ is opened.

The second transconductance amplifier 350 may be coupled at a non-inverting input to the output of the second op amp 320. Its inverting input may be alternately coupled to the output of second op amp 320 through switch $R_{GN1}$ or to the inverting input of the second op amp 320 and the $R_{ns}$ sense switches of the cells 330.1-330.N through switch $R_{GN2}$ when D=N and $R_{GN2}$ and $R_{nc}$ are closed. The output of transconductance amplifier 350 may be continually connected to the selected cell in the DAC 300 (cell 330.N in the illustrated embodiment). The second transconductance amplifier 350 may generate an output current that is based on a voltage difference established between the second op amp's output and the op amp's inverting input. An output of the second transconductance amplifier 350 may be input to a selected cell of the DAC 300 when switches $R_{GP2}$ is closed and $R_{GP1}$ is opened.

The transconductance amplifiers 340, 350 may generate current outputs that counteract the $I_{bp}$ and $I_{bn}$ terms of equation (iv) above. Specifically, the transconductance amplifiers may generate a current $I_{out}$ having the form $I_{out}=\Delta V*Gm$, where $\Delta V$ represents a voltage across the inputs of the respective amplifier 340 or 350 and Gm is a gain factor. Each $\Delta V$ may be generated by $I_{bp}$ and $I_{bn}$ multiplied by $R_{pc}$ or $R_{nc}$ respectively, and the respective $\Delta V$ may be deliberated generated by $R_{pc}$ or $R_{nc}$ when the associated opamp 310 or 320 is not switched via cells 330.1-330.N to the output node. In practice the gain factor Gm may be set to be inversely proportional to the resistance of a DAC resistor 332.1, 334.1, and may be represented by equation (v).

During operation, in response to an input code word D, the control logic 360 may control switches of the cells to generate a proper output voltage on the $V_{out}$ terminal. When 0<D<N, sense/force switches of at least one cell will couple the first op amp 310 to the $V_{out}$ terminal and sense/force switches of at least one other cell will couple the second op amp 320 to the $V_{out}$ terminal. In such a case, the control logic 360 will ensure that the cell to which the first transconductance amplifier 340 is coupled (cell 330.1 in the illustrated embodiment) will be connected to the first op amp 310 via the $R_{ps}$, $R_{pf}$ switches of that cell. Similarly, the control logic may couple the cell to which the second transconductance amplifier 350 is coupled (cell 330.N in the illustrated embodiment), to the second op amp 320 via the $R_{ns}$, $R_{nf}$ switches of that cell. During this interval both $I_{bp}$ and $I_{bn}$ may contribute to an error at the output.

In an embodiment, the DAC 300 also may include coupling switches $R_{pc}$, $R_{nc}$, which may be represented by their impedances, provided for each of the op amps 310, 320 coupling the op amp's output to its inverting input. The $R_{pc}$ switch may be set to $M*R_{ps}$, and the $R_{nc}$ switch may be set to $M*R_{ns}$ where again M is a multiplier of the switch resistance. These switches may be engaged based on the value of D. When D=0, for example, the control logic 360 will connect all cells 330.1-330.N of the DAC 300 to the output of the second op amp 320. In this event, the control logic 360 may cause switch $R_{pc}$ to close, connecting the first op amp's output terminal to its inverting input. Switch $R_{GP1}$ may open and switch $R_{GP2}$ may close, disconnecting the inverting input of transconductance amplifier 340 from the output of first op amp 310 to the inverting input of the first op amp. Closing $R_{pc}$ may generate a differential voltage across the inputs of first transconductance amplifier 340 that is proportional to $I_{bp}$ and $R_{pc}$ (or $R_{ps}$). Transconductance amplifier 340 may output a current to a selected cell (cell 330.1 in the illustrated embodiment). The output current may assure that the contribution to the voltage error at the output by $I_{bp}$ is constant even when D=0.

When D=0 (or more generally when D<N), $R_{GN1}$ may remain closed and $R_{GN2}$ may remain open. The inputs of the second transconductance amplifier 350 may both be connected to the output of op amp 320. In this manner, the second transconductance amplifier 350 should generate no output current because ΔV at that amplifier will be nearly zero. In practice, the input offset voltage of the transconductance amplifier may cause a small amount of error current to be injected when ΔV is nearly zero, because the transconductance amplifier is always connected to the node. This small error from the error current may be constant and less of a problem than the preexisting variable error component.

Similarly, when D=N, the control logic 360 will connect all cells 330.1-330.N of the DAC 300 to the output of the first op amp 310. In this event, the control logic 360 may cause switch $R_{nc}$ to close, connecting the second op amp's output terminal to its inverting input. Switch $R_{GN1}$ may open and switch $R_{GN2}$ may close, disconnecting the inverting input of transconductance amplifier 350 from the output of second op amp 320 to the inverting input of the second op amp. Closing $R_{nc}$ may generate a differential voltage across the inputs of second transconductance amplifier 350 that is proportional to $I_{bp}$ and $R_{nc}$ (or $R_{ns}$). Transconductance amplifier 350 may output a current to a selected cell (cell 330.1 in the illustrated embodiment). The output current may assure that the contribution to the voltage error at the output by $I_{bn}$ is constant even when D=N.

When D=N, $R_{GP1}$ may remain closed and $R_{GP2}$ may remain open. The inputs of the first transconductance amplifier 340 may both be connected to the output of op amp 310. In this manner, the first transconductance amplifier 340 should generate no output current because ΔV at that amplifier will be nearly zero. In practice, the input offset voltage of the transconductance amplifier may cause a small amount of error current to be injected when ΔV is nearly zero, because the transconductance amplifier is always connected to the node. This small error from the error current may be constant and less of a problem than the preexisting variable error component.

The selection of the node in the cells to inject the correction current may be made by a designer in the equally-weighted segmented DAC. A designer may also make a selection for the correction factor of the transconductance amplifiers.

A designer may also choose the node for injection of the current for a binary weighted DAC, but may select to inject the correction current into a LSB segment further from the output because of the smaller gain. A selection of a node too close to the output may output a correction current from the transconductance amplifier that is too low to achieve on an integrated circuit. A node that is too close to the output may also create tiny leakage currents which may cause large errors at the output. A selection of a node that is too far from the output may result in an injected correction current that is too large to make the transconductance amplifiers linear. In an example embodiment, a designer may choose a node that requires a correction current that is between 100 nA to 1 uA to improve the linearity.

Figure 4:
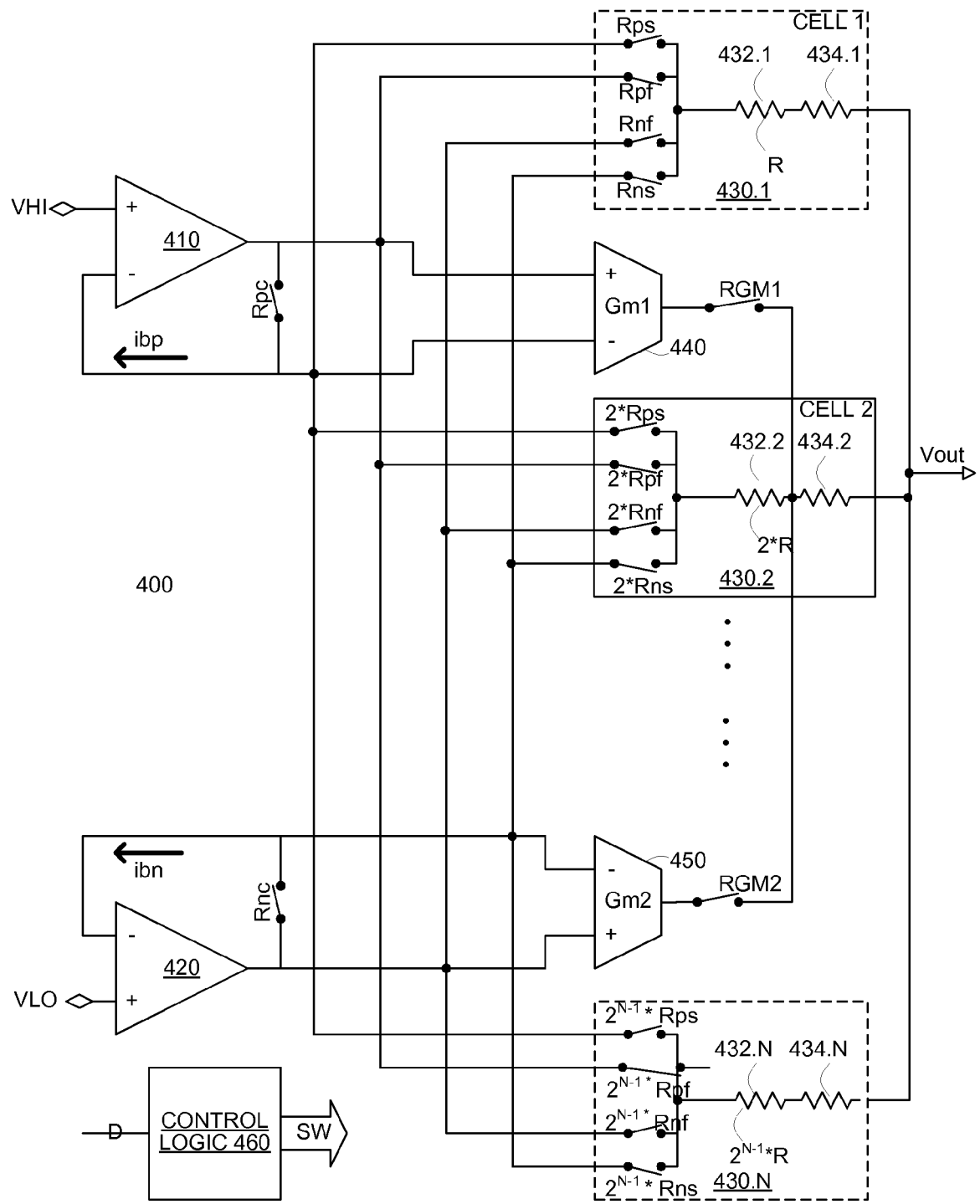
FIG. 4 is a diagram of a binary weighted force/sense voltage-mode DAC with a transconductance amplifier to generate a correction current.

FIG. 4 is a circuit diagram of a binary weighted DAC 400 according to an embodiment of the present invention. DAC 400 may include a pair of op amps 410, 420 and a plurality of binary weighted cells 430.1-430.N. Reference voltages $V_{HI}$ and $V_{LO}$ may be supplied to the non-inverting input of the respective op amps 410, 420. Each cell may include two pairs of switch controlled transistors and a resistor element, both of which are weighted. As illustrated in FIG. 4, cell 430.1 may contain switches $R_{ps}$, $R_{pf}$, $R_{ns}$, and $R_{nf}$ which are represented by their impedance values, and a resistor designated as R. Each of the subsequent cells may have switches and resistor elements weighted exponentially by a factor of 2. Subsequent cell 430.2 may contain switches weighted as $2*R_{es}$, $2*R_{pf}$, $2*R_{ns}$, and $2*R_{nf}$ and a resistor element weighted $2*R$. Cell 430.N may contain weighted switches $2^{N-1}*R_{ps}$, $2^{N-1}*R_{pf}$, $2^{N-1}*R_{ns}$, and $2^{N-1}*R_{nf}$ and a resistor element weighted $2^{N-1}*R$. Control logic 460 may be applied to cells 430.1-430.N. Each of the activated cells may contribute incrementally to a voltage at output terminal inversely proportional to its binary weighting.

The first transconductance amplifier 440 may be coupled at a non-inverting input to the output of the first op amp 410. Its inverting input may be coupled to an inverting input of the first op amp 410 and also to the associated $R_{ps}$ sense switches of the cells 430.1-430.N. The first transconductance amplifier 440 may generate an output current that is based on a voltage difference established between the first op amp's output and the op amp's inverting input. An output of the first transconductance amplifier 440 may be input into a node in the LSB section of the DAC core of DAC 400, when switch $R_{GM1}$ is closed. Switch $R_{GM1}$ may selectably connect and disconnect transconductance amplifier 440 from the node. Transconductance amplifier 440 may be only connected to the node when no cells 430.1-430.N are connected to the first op amp 410.

The second transconductance amplifier 450 may be coupled at a non-inverting input to the output of the second op amp 420. Its inverting input may be coupled to an inverting input of the second op amp 420 and also to the associated $R_{ns}$ sense switches of the cells 430.1-430.N. The second transconductance amplifier 450 may generate an output current that is based on a voltage difference established between the second op amp's output and the op amp's inverting input. An output of the second transconductance amplifier 450 is input into a node in the LSB section of the DAC core of DAC 400, when switch $R_{GM2}$ is closed. The second transconductance amplifier 450 may inject a correction current into the same node as the first transconductance amplifier 440, or separate nodes may be chosen. If the same node is chosen (as depicted in FIG. 4), both correction paths may have the same gain, which may be desirable. Switch $R_{GM2}$ may selectably connect and disconnect transconductance amplifier 450 from the node. Transconductance amplifier 450 may be only connected to the node when no cells 430.1-430.N are connected to the second op amp 420.

The transconductance amplifiers 440, 450 may generate current outputs that counteract the $I_{bp}$ and $I_{bn}$ terms of equation (iv) above. Specifically, the transconductance amplifiers may generate a current $I_{out}$ having the form $I_{out}=\Delta V*Gm$, where ΔV represents a voltage across the inputs of the respective amplifier 440 or 450 and Gm is a gain factor. In practice the gain factor Gm may be set to be inversely proportional to a unit resistance R of binary weighted resistor 432.1-434.N, and may be represented by the equation:

$$Gm = \frac{1}{K*R}, \quad \text{(vi)}$$

where K is a correction factor, and R is a base resistance.

During operation, in response to an input code word D, the control logic 460 may control switches of the cells to generate an output voltage on the $V_{out}$ terminal that is proportional to the binary weights of the cells. When 0<D<N, sense/force switches of at least one cell will couple the first op amp 410 to the $V_{out}$ terminal and sense/force switches of at least one other cell will couple the second op amp 420 to the $V_{out}$ terminal. In such a case, the control logic 460 will ensure that the cell to which the first transconductance amplifier 440 is coupled (cell 430.1 in the illustrated embodiment) will be connected to the first op amp 410 via the $R_{ps}$, $R_{pf}$ (or $2^M*R_{ps}$, $2^M*R_{pf}$ in any cell) switches of that cell. Similarly, the control logic may couple the cell to which the second transconductance amplifier 450 is coupled, to the second op amp 420 via the $2^M*R_{ps}$, $2^M*R_{pf}$ switches of that cell. During this interval both $I_{bp}$ and $I_{bn}$ may contribute to an error at the output.

In an embodiment, the DAC 400 also may include coupling switches $R_{pc}$, $R_{nc}$, provided for each of the op amps 410, 420 coupling the op amp's output to its inverting input. $R_{pc}$ may be equal to $M*R_{ps}$, whereas $R_{nc}$ may be equal to $M*R_{ns}$, where M represents a switch resistance multiplier. These switches may be engaged when D=0 or D=N. When D=0, for example, the control logic 460 will connect all cells 430.1-430.N of the DAC 400 to the output of the second op amp 420. In this event, the control logic 460 may cause switch $R_{pc}$ to close, connecting the first op amp's output terminal to its inverting input. Closing $R_{pc}$ may generate a differential voltage across the inputs of transconductance amplifier 440 that is proportional to $I_{bp}$ and $R_{pc}$ (or $R_{ps}$). Switch $R_{GM1}$ may close and transconductance amplifier 440 may output a current to a node in the binary weighted LSB section of the DAC core.

Similarly, when D=N, the control logic 460 will connect all cells 430.1-430.N of the DAC 400 to the output of the first op amp 410. In this event, the control logic 460 may cause switch $R_{nc}$ to close, connecting the second op amp's output terminal to its inverting input. Closing $R_{nc}$ may generate a differential voltage across the inputs of transconductance amplifier 450 that is proportional to $I_{bn}$ and $R_{nc}$ (or $R_{ns}$). Switch $R_{GM2}$ may close and transconductance amplifier 450 may output a current to a node in the binary weighted LSB section of the DAC core. Any resistance value of $R_{GM1}$ and $R_{GM2}$ may be ignored because the switches are in series with the transconductance, which has an infinite output resistance.

Similar to a segmented DAC structure, in a binary weighted structure, an input offset voltage may be needed to reset the output of transconductance amplifiers 440 and 450 to zero when no correction current is to be generated. Transconductance amplifiers 440 and 450 may be sensitive to an input offset voltage, therefore FIG. 5 illustrates an embodiment where the inputs of the transconductance amplifiers are shorted together when no output current is needed.

Figure 5:
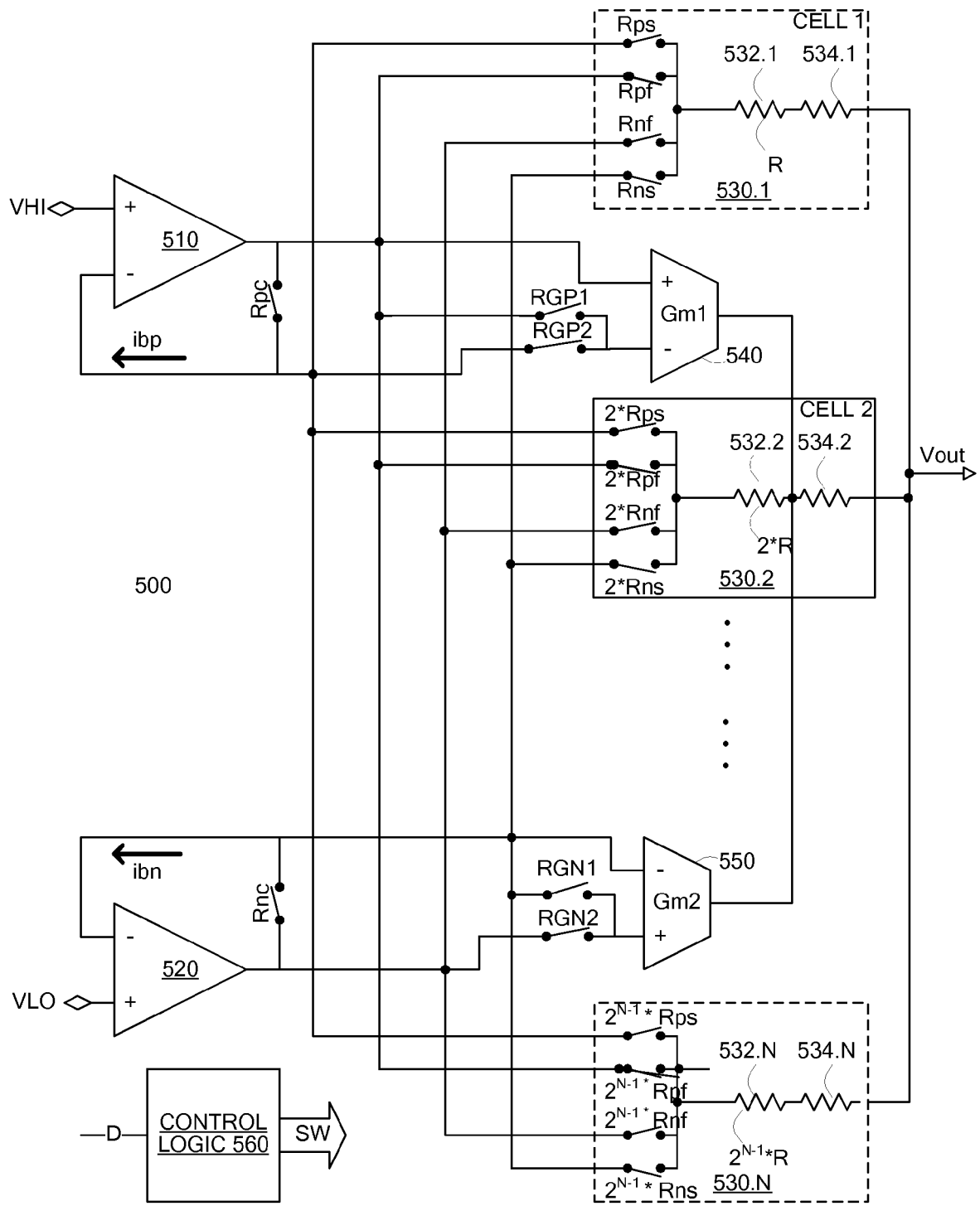
FIG. 5 is a diagram of a binary weighted force/sense voltage-mode DAC with a transconductance amplifier immune to a voltage offset.

FIG. 5 is a circuit diagram of a binary weighted DAC 500 according to an embodiment of the present invention. DAC 500 may include a pair of op amps 510, 520 and a plurality of binary weighted cells 530.1-530.N. Reference voltages $V_{HI}$ and $V_{LO}$ may be supplied to the non-inverting input of the respective op amps 510, 520. Each cell may include two pairs of switch controlled transistors and a resistor element, both of which are weighted. As illustrated in FIG. 5, cell 530.1 may contain switches $R_{ps}$, $R_{pf}$, $R_{ns}$, and $R_{nf}$ which are represented by their impedance values, and a resistor designated as R. Each of the subsequent cells may have switches and resistor elements weighted exponentially by a factor of 2. Subsequent cell 530.2 may contain switches weighted as $2*R_{ps}$, $2*R_{pf}$, $2*R_{ns}$, and $2*R_{nf}$ and a resistor element weighted $2*R$. Cell 530.N may contain weighted switches $2^{N-1}*R_{ps}$, $2^{N-1}*R_{pf}$, $2^{N-1}*R_{ns}$, and $2^{N-1}*R_{nf}$ and a resistor element weighted $2^{N-1}*R$. Control logic 560 may be applied to cells 530.1-530.N. Each of the activated cells may contribute incrementally to a voltage at output terminal inversely proportional to its binary weighting.

The first transconductance amplifier 540 may be coupled at a non-inverting input to the output of the first op amp 510. Its inverting input may be alternately coupled to the output of first op amp 510 through switch $R_{GP1}$ or to the inverting input of the first op amp 510 and the associated $R_{ps}$ sense switches of the cells 530.1-530.N through switch $R_{GP2}$ when D=0 and $R_{GP2}$ and $R_{pc}$ are closed. In contrast to transconductance amplifier 440, transconductance amplifier 540 may be continually connected to the selected cell in the DAC at its output. The first transconductance amplifier 540 may generate an output current that is based on a voltage difference established between the first op amp's output and the op amp's inverting input. An output of the first transconductance amplifier 540 may be input to a node in the LSB section of the DAC core of DAC 500, when switches $R_{GP2}$ is closed and $R_{GP1}$ is opened.

The second transconductance amplifier 550 may be coupled at a non-inverting input to the output of the second op amp 520. Its inverting input may be alternately coupled to the output of second op amp 520 through switch $R_{GN1}$ or to the inverting input of the second op amp 520 and the associated $R_{ns}$ sense switches of cells 530.1-530.N through switch $R_{GN2}$ when D=N and $R_{GN2}$ and $R_{nc}$ are closed. The output of transconductance amplifier 550 may be continually connected to the DAC core of DAC 500. The second transconductance amplifier 550 may generate an output current that is based on a voltage difference established between the second op amp's output and the op amp's inverting input. An output of the second transconductance amplifier 550 may be input to a node in the LSB section of the DAC core of DAC 500, when switches $R_{GP2}$ is closed and $R_{GP1}$ is opened. The second transconductance amplifier 550 may inject a correction current into the same node as the first transconductance amplifier 540, or separate nodes may be chosen. If the same node is chosen (as depicted in FIG. 5), both correction paths may have the same gain, which may be desirable.

The transconductance amplifiers 540, 550 may generate current outputs that counteract the $I_{bp}$ and $I_{bn}$ terms of equation (iv) above. Specifically, the transconductance amplifiers may generate a current $I_{out}$ having the form $I_{out}=\Delta V*Gm$, where $\Delta V$ represents a voltage across the inputs of the respective amplifier 440 or 450 and Gm is a gain factor set by equation (vi).

During operation, in response to an input code word D, the control logic 560 may control switches of the cells to generate a proper output voltage on the $V_{out}$ terminal that is proportional to the binary weights of the cells. When 0<D<N, sense/force switches of at least one cell will couple the first op amp 510 to the $V_{out}$ terminal and sense/force switches of at least one other cell will couple the second op amp 520 to the $V_{out}$ terminal. In such a case, the control logic 560 will ensure that the cell to which the first transconductance amplifier 540 is coupled (cell 530.1 in the illustrated embodiment) will be connected to the first op amp 510 via the associated $2^M*R_{ps}$, $2^M*R_{pf}$ switches of that cell. Similarly, the control logic may couple the cell to which the second transconductance amplifier 550 is coupled, to the second op amp 520 via the $R_{ns}$, $R_{nf}$ switches of that cell. During this interval both $I_{bp}$ and $I_{bn}$ may contribute to an error at the output.

In an embodiment, the DAC 500 also may include coupling switches $R_{pc}$, $R_{nc}$, provided for each of the op amps 510, 520 coupling the op amp's output to its inverting input. $R_{pc}$ may be equal to $M*R_{ps}$, whereas $R_{nc}$ may be equal to $M*R_{ns}$, where M is a switch resistance multiplier. These switches may be engaged when D=0 or D=N. When D=0, for example, the control logic 560 will connect all cells 530.1-530.N of the DAC 500 to the output of the second op amp 520. In this event, the control logic 560 may cause switch $R_{pc}$ to close, connecting the first op amp's output terminal to its inverting input. Switch $R_{GP1}$ may open and switch $R_{GP2}$ may close, disconnecting the inverting input of transconductance amplifier 540 from the output of first op amp 510 to the inverting input of the first op amp. Closing $R_{pc}$ may generate a differential voltage across the inputs of first transconductance amplifier 540 that is proportional to $I_{bp}$ and $R_{pc}$ (or $R_{ps}$). As N may be greater in a binary weighted DAC than a segmented DAC, $R_{pc}$ may be greater in DAC 500 than in the segmented DAC, leading to a larger $\Delta V$. Transconductance amplifier 540 may output a current to a node in the binary weighted LSB section of the DAC core.

When D=0 (or more generally, D<N), $R_{GN1}$ may remain closed and $R_{GN2}$ may remain open. The inputs of the second transconductance amplifier 550 may both be connected to the output of op amp 520. In this manner, the second transconductance amplifier 550 should generate no output current because $\Delta V$ at that amplifier will be nearly zero. In practice, the input offset voltage of the transconductance amplifier may cause a small amount of error current to be injected when $\Delta V$ is nearly zero, because the transconductance amplifier is always connected to the node. This small error from the error current may be constant and less of a problem than the pre-existing variable error component.

Similarly, when D=N, the control logic 560 will connect all cells 530.1-530.N of the DAC 500 to the output of the first op amp 510. In this event, the control logic 560 may cause switch $R_{nc}$ to close, connecting the second op amp's output terminal to its inverting input. Switch $R_{GN1}$ may open and switch $R_{GN2}$ may close, disconnecting the inverting input of transconductance amplifier 550 from the output of second op amp 520 to the inverting input of the second op amp. Closing $R_{nc}$ may generate a differential voltage across the inputs of second transconductance amplifier 550 that is proportional to $I_{bp}$ and $R_{nc}$ (or $R_{ns}$). Transconductance amplifier 550 may output a current to a node in the binary weighted LSB section of the DAC core.

When D=N, $R_{GP1}$ may remain closed and $R_{GP2}$ may remain open. The inputs of the first transconductance amplifier 540 may both be connected to the output of op amp 510. In this manner, the first transconductance amplifier 540 should generate no output current because $\Delta V$ at that amplifier will be nearly zero. In practice, the input offset voltage of the transconductance amplifier may cause a small amount of error current to be injected when $\Delta V$ is nearly zero, because the transconductance amplifier is always connected to the node. This small error from the error current may be constant and less of a problem than the preexisting variable error component.

Figure 6:
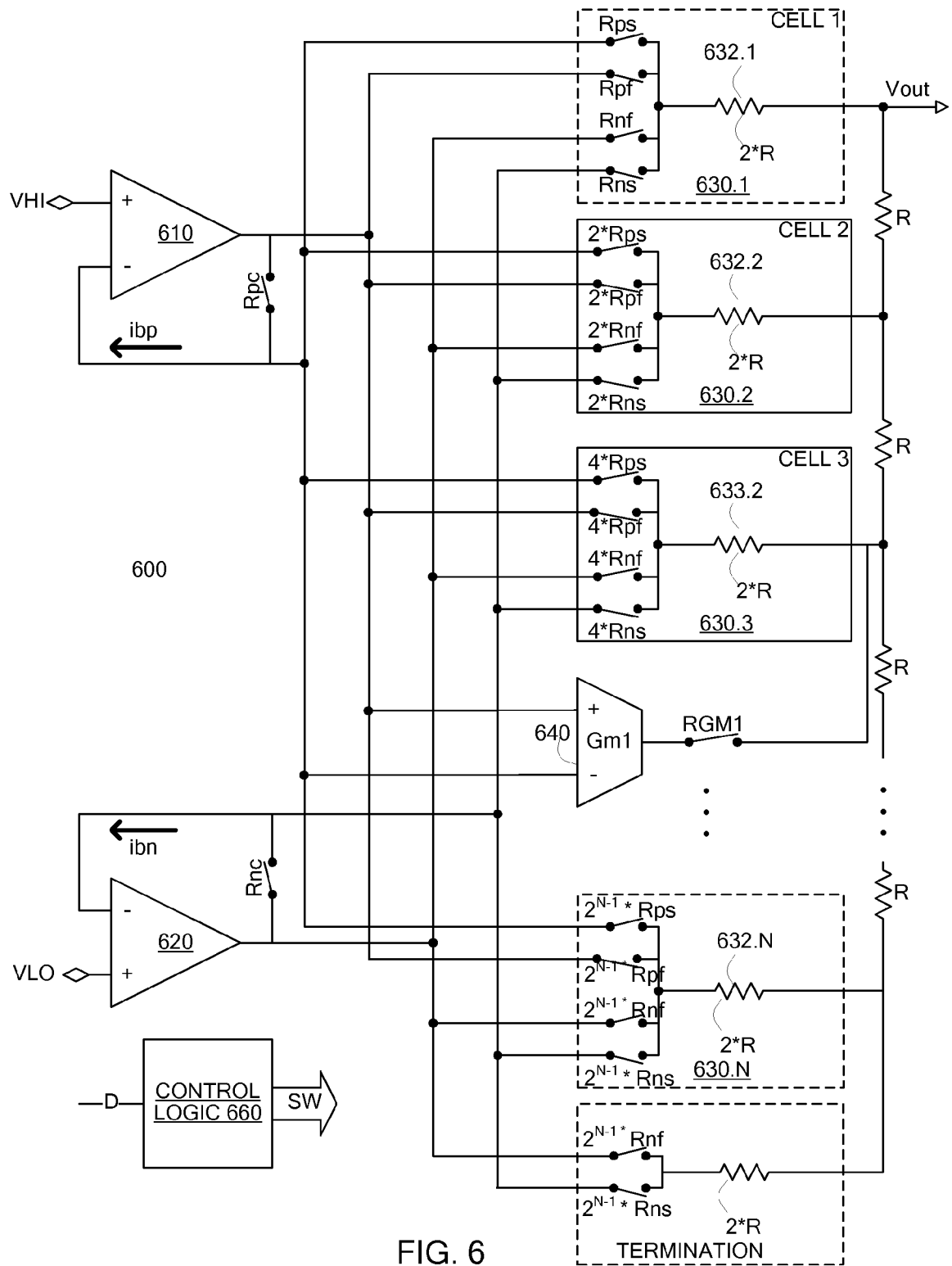
FIG. 6 is a diagram of a R2R force/sense voltage-mode DAC with a transconductance amplifier to generate a correction current.

In an example embodiment, an R2R DAC structure may be used. FIG. 6 is a circuit diagram of a DAC with an R2R architecture 600 according to an embodiment of the present invention. DAC 600 may include a pair of op amps 610, 620 and a plurality of binary weighted cells 630.1-630.N. Reference voltages $V_{HI}$ and $V_{LO}$ may be supplied to the non-inverting input of the respective op amps 610, 620. Each cell may include two pairs of switch controlled transistors, which are weighted, and a resistor element having twice the resistance of a base resistor, R. As illustrated in FIG. 6, cell 630.1 may contain switches $R_{ps}$, $R_{pf}$, $R_{ns}$, and $R_{nf}$ and a resistor designated as 2*R. Each of the subsequent cells may have switch elements weighted exponentially by a factor of 2 and the same resistor element 2*R. Subsequent cell 630.2 may contain switches weighted as $2*R_{ps}$, $2*R_{pf}$, $2*R_{ns}$, and $2*R_{nf}$. Cell 630.N may contain weighted switches $2^{N-1}*R_{ps}$, $2^{N-1}*R_{pf}$, $2^{N-1}*R_{ns}$, and $2^{N-1}*R_{nf}$. Each of outputs of the cells 630.1-630.N may be connected by base resistor R. Control logic 660 may be applied to cells 630.1-630.N. Each of the activated cells may contribute incrementally to a voltage at output terminal inversely proportional to its weighting.

DAC 600 may also contain a termination cell containing a termination resistor as depicted in FIG. 6. The presence of the termination cell may ensure that $I_{bn}$ may affect the output voltage at all times and create a constant error contribution, even when D=N, and all the cells 630.1-630.N are connected to op amp 610. Therefore the presence of the termination node may allow for the use of only a single transconductance amplifier, as $I_{bn}$ maintains a constant contribution to the error at the output at all times and no correction circuit is needed to produce this.

The transconductance amplifier 640 may be coupled at a non-inverting input to the output of the first op amp 610. Its inverting input may be coupled to an inverting input of the first op amp 610 and also to the associated $R_{ps}$ sense switches of the cells 630.1-630.N. The transconductance amplifier 640 may generate an output current that is based on a voltage difference established between the first op amp's output and the op amp's inverting input. An output of the transconductance amplifier 640 may be input into a node in the LSB section of the DAC core of DAC 600, or a mid-range node such as at cell 630.3 as depicted in FIG. 6, when switch $R_{GM1}$ is closed. Switch $R_{GM1}$ may selectably connect and disconnect transconductance amplifier 640 from the node. Transconductance amplifier 640 may be only connected to the node when no cells 630.1-630.N are connected to the first op amp 610.

A designer may choose the node for injection of the current for the R2R DAC by selecting to inject the correction current into a mid-range node or an LSB segment further from the output because of the smaller gain produced by those nodes. A selection of a mid-range node in the R2R DAC may allow for a correction current from the transconductance amplifier that may be achieved on an integrated circuit. Selecting a mid-range node may also avoid the creation of leakage current that may result from injecting the correction current into an MSB segment, which subsequently may cause large errors at the output. The selection of a mid-range node may also ensure that the transconductance amplifiers remain linear. In an example embodiment, a designer may choose a node that requires a correction current that is between 100 nA to 1 uA to improve the linearity. A mid-range node at the output of cell 630.3 is depicted in FIG. 6.

During operation, in response to an input code word D, the control logic 660 may control switches of the cells to generate an output voltage on the $V_{out}$ terminal that is proportional to the binary weights of the cells. When 0<D<N, sense/force switches of at least one cell will couple the first op amp 610 to the $V_{out}$ terminal through the resistor element 2*R and the associated resistance at the output R*X−1, where X is the cell's position ranging from 0 to N−1. Sense/force switches of at least one other cell will couple the second op amp 620 to the $V_{out}$ terminal through the resistor element 2*R and the associated resistance at the output R*X−1. In such a case, the control logic 660 may ensure that the cell to which the transconductance amplifier 640 is coupled will be connected to the first op amp 610 via the $R_{ps}$, $R_{pf}$ (or $2^{X}*R_{ps}$, $2^{X}*R_{pf}$ in any cell) switches of that cell.

In an embodiment, the DAC 600 also may include coupling switches $R_{pc}$, $R_{nc}$, provided for each of the op amps 610, 620 coupling the op amp's output to its inverting input. $R_{pc}$ may be equal to $M*R_{ps}$, whereas $R_{nc}$ may be equal to $M*R_{ns}$, where M represents a switch resistance multiplier. These switches may be engaged when D=0 or D=N. When D=0, for example, the control logic 660 will connect all cells 630.1-630.N of the DAC 600 to the output of the second op amp 620. In this event, the control logic 660 may cause switch $R_{pc}$ to close, connecting the first op amp's output terminal to its inverting input. Closing $R_{pc}$ may generate a differential voltage across the inputs of transconductance amplifier 640 that is proportional to $I_{bp}$ and $R_{pc}$ (or $R_{ps}$). Switch $R_{GM1}$ may close and transconductance amplifier 640 may output a current to a mid-range node in the LSB section of the DAC core.

When D=N, the control logic 660 will connect all cells 630.1-630.N of the DAC 600 to the output of the first op amp 610. In this event, the control logic 660 may cause switch $R_{nc}$ to close, connecting the second op amp's output terminal to its inverting input. Unlike the binary-weighed DAC 400, because of the presence of the termination cell, $I_{bn}$ still contributes to the error at the output at D=N. At D=N, both $I_{bp}$ and $I_{bn}$ provide a constant contribution to the error at the output, and no correction current is injected into cells 630.1-630.N.

Similar to both segmented and binary weighted DAC structure, in an R2R DAC structure, an input offset voltage may be needed to reset the output of transconductance amplifier 640 to zero when no correction current is to be generated. Transconductance amplifier 640 may be sensitive to an input offset voltage, therefore FIG. 7 illustrates an embodiment where the inputs of the transconductance amplifier are shorted together when no output current is needed.

Figure 7:
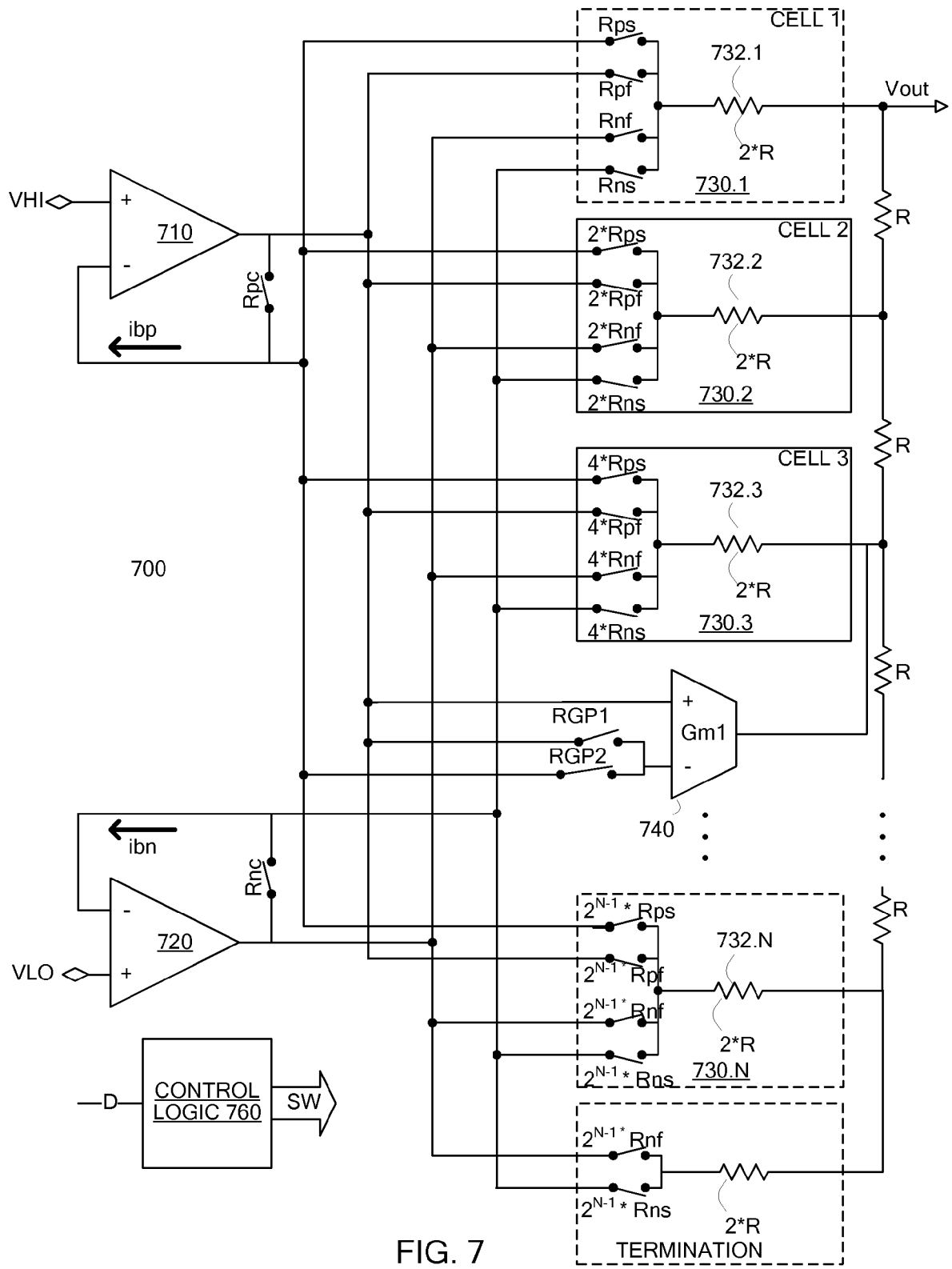
FIG. 7 is a diagram of a R2R force/sense voltage-mode DAC with a transconductance amplifier immune to a voltage offset.

FIG. 7 is a circuit diagram of a DAC with an R2R architecture 700 according to an embodiment of the present invention. DAC 700 may include a pair of op amps 710, 720 and a plurality of binary weighted cells 730.1-730.N. Reference voltages $V_{HI}$ and $V_{LO}$ may be supplied to the non-inverting input of the respective op amps 710, 720. Each cell may include two pairs of switch controlled transistors, which are weighted, and a resistor element having twice the resistance of a base resistor, R. As illustrated in FIG. 7, cell 730.1 may contain switches $R_{ps}$, $R_{pf}$, $R_{ns}$, and $R_{nf}$ and a resistor designated as 2*R. Each of the subsequent cells may have switches elements weighted exponentially by a factor of 2 and the same resistor element 2*R. Subsequent cell 730.2 may contain switches weighted as $2*R_{ps}$, $2*R_{pf}$, $2*R_{ns}$, and $2*R_{nf}$. Cell 730.N may contain weighted switches $2^{N-1}*R_{ps}$, $2^{N-1}*R_{pf}$, $2^{N-1}*R_{ns}$, and $2^{N-1}*R_{nf}$. Each of outputs of the cells 730.1-730.N may be connected by base resistor R. Control logic 760 may be applied to cells 730.1-730.N. Each of the activated cells may contribute incrementally to a voltage at output terminal inversely proportional to its weighting.

DAC 700 may also contain a termination cell containing a termination resistor as depicted in FIG. 7. The presence of the termination cell may ensure that $I_{bn}$ may affect the output voltage at all times and create a constant error contribution, even when D=N, and all the cells 730.1-730.N are connected to op amp 710. Therefore the presence of the termination node may allow for the use of a single transconductance amplifier, as $I_{bn}$ maintains a constant contribution to the error at the output at all times and no correction circuit is needed to produce this.

Transconductance amplifier 740 may be coupled at a non-inverting input to the output of the first op amp 710. Its inverting input may be alternately coupled to the output of first op amp 710 through switch $R_{GP1}$ or to the inverting input of the first op amp 710 and the associated $R_{ps}$ sense switches of the cells 730.1-730.N through switch $R_{GP2}$ when D=0 and $R_{GP2}$ and $R_{pc}$ are closed. In contrast to transconductance amplifier 640, transconductance amplifier 740 may be continually connected to the selected cell in the DAC at its output. Transconductance amplifier 740 may generate an output current that is based on a voltage difference established between the first op amp's output and the op amp's inverting input. An output of transconductance amplifier 740 may be input to a mid-range node in the LSB section of the DAC core of DAC 700 (such as cell 730.3 as depicted in FIG. 7), when switches $R_{GP2}$ is closed and $R_{GP1}$ is opened.

During operation, in response to an input code word D, the control logic 760 may control switches of the cells to generate an output voltage on the $V_{out}$ terminal that is proportional to the binary weights of the cells. When 0<D<N, sense/force switches of at least one cell will couple the first op amp 710 to the $V_{out}$ terminal through the resistor element 2*R and the associated resistance at the output R*X−1, where X is the cell's position ranging from 1 to N. Sense/force switches of at least one other cell will couple the second op amp 720 to the $V_{out}$ terminal through the resistor element 2*R and the associated resistance at the output R*X−1, where X is the cell's position ranging from 0 to N−1. In such a case, the control logic 760 may ensure that the cell to which the transconductance amplifier 740 is coupled will be connected to the first op amp 710 via the $R_{ps}$, $R_{pf}$ (or $2^{X}*R_{ps}$, $2*R_{pf}$ in any cell) switches of that cell.

In an embodiment, the DAC 700 also may include coupling switches $R_{pc}$, $R_{nc}$, provided for each of the op amps 710, 720 coupling the op amp's output to its inverting input. $R_{pc}$ may be equal to $M*R_{ps}$, whereas $R_{nc}$ may be equal to $M*R_{ns}$, where M is a switch resistance multiplier. These switches may be engaged when D=0 or D=N. When D=0, for example, the control logic 760 will connect all cells 730.1-730.N of the DAC 700 to the output of the second op amp 720. In this event, the control logic 760 may cause switch $R_{pc}$ to close, connecting the first op amp's output terminal to its inverting input. Switch $R_{GP1}$ may open and switch $R_{GP2}$ may close, disconnecting the inverting input of transconductance amplifier 740 from the output of first op amp 710 to the inverting input of the first op amp. Closing $R_{pc}$ may generate a differential voltage across the inputs of first transconductance amplifier 740 that is proportional to $I_{bp}$ and $R_{pc}$ (or $R_{ps}$). Transconductance amplifier 740 may output a current to a mid-range node in the LSB section of the DAC core.

When D=N, the control logic 760 will connect all cells 730.1-730.N of the DAC 700 to the output of the first op amp 710. In this event, the control logic 760 may cause switch $R_{nc}$ to close, connecting the second op amp's output terminal to its inverting input. Unlike the binary-weighed DAC 500, because of the presence of the termination cell, $I_{bn}$ still contributes to the error at the output at D=N. At D=N, both $I_{bp}$ and $I_{bn}$ provide a constant contribution to the error at the output, and no correction current is injected into cells 730.1-730.N.

When D=N, $R_{GP1}$ may remain closed and $R_{GP2}$ may remain open. The inputs of the first transconductance amplifier 740 may both be connected to the output of op amp 710. In this manner, transconductance amplifier 740 should generate no output current because ΔV at that amplifier will be nearly zero. In practice, the input offset voltage of the transconductance amplifier may cause a small amount of error current to be injected when ΔV is nearly zero, because the transconductance amplifier is always connected to the node. This small error from the error current may be constant and less of a problem than the preexisting variable error component.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A digital to analog converter, comprising:
   a pair of operational amplifiers each coupled to a respective reference voltage at a first input thereof;
   a plurality of DAC cells, each coupled to an output and to a second input of the first operational amplifier by a first switch path and each coupled to an output and a second input of the second operational amplifier by a second switch path; and
   a pair of transconductance amplifiers, each having inputs coupled to a shorting switch through which input bias current of the respective amplifier can flow and having an output to a respective one of the DAC cells.

2. The digital to analog converter according to claim 1, wherein the output of a respective transconductance amplifier is coupled to the respective DAC cell through an additional switch path.

3. The digital to analog converter according to claim 2, wherein the additional switch path of the first transconductance amplifier is closed when none of the plurality of DAC cells in the voltage-mode DAC are connected to a high reference voltage.

4. The digital to analog converter according to claim 2, wherein the additional switch path of the second transconductance amplifier is closed when none of the plurality of DAC cells in the voltage-mode DAC are connected to a low reference voltage.

5. The digital to analog converter according to claim 1, further comprising control logic that inputs a digital input code to activate at least one of the DAC cells.

6. The digital to analog converter according to claim 1, wherein each of the plurality of DAC cells contains two pairs of force and sense switches that are alternately closed when a control signal is applied to each of the DAC cells.

7. The digital to analog converter according to claim 6, wherein each respective switch is coupled to the inputs of an associated transconductance amplifier.

8. The digital to analog converter according to claim 1, wherein the inputs of the pair of transconductance amplifiers are coupled to the output and the second input of the associated operational amplifier.

9. The digital to analog converter according to claim 1, wherein each of the transconductance amplifiers outputs a correction current to negate a biasing current to the associated operational amplifier.

10. The digital to analog converter according to claim 1, wherein the respective reference voltage is a high or low voltage.

11. The digital to analog converter according to claim 1, wherein the digital to analog converter is segmented.

12. The digital to analog converter according to claim 1, wherein the digital to analog converter is binary weighted.

13. A digital to analog converter, comprising:
    a pair of operational amplifiers each coupled to a respective reference voltage at a first input thereof;
    a plurality of DAC cells, each coupled to an output and to a second input of the first operational amplifier by a first switch path and each coupled to an output and a second input of the second operational amplifier by a second switch path; and
    a pair of transconductance amplifiers, having a first input coupled to the output of an associated operational amplifier and a second input switchably coupled to the output and the second input of the associated operational amplifier, the pair of transconductance amplifiers having an output to a respective one of the DAC cells.

14. The digital to analog converter according to claim 13, wherein each of the plurality of DAC cells contains two pairs of force and sense switches that are alternately closed when a control signal is applied to each of the DAC cells.

15. The digital to analog converter according to claim 13, further comprising control logic that inputs a digital input code to activate at least one of the DAC cells.

16. The digital to analog converter according to claim 13, further comprising a pair of switches, each respective switch coupled to the output and the second input of the associated operational amplifiers.

17. The digital to analog converter according to claim 16, wherein each respective switch is coupled to the inputs of an associated transconductance amplifier.

18. The digital to analog converter according to claim 13, wherein each of the transconductance amplifiers outputs a correction current to negate a biasing current to the associated operational amplifier.

19. The digital to analog converter according to claim 13, wherein the second input of the first transconductance amplifier is connected to the second input of the first operational amplifier when none of the plurality of DAC cells are connected to a high reference voltage, the second input of the second transconductance amplifier being connected to the output of the second operational amplifier.

20. The digital to analog converter according to claim 13, wherein the second input of the second transconductance amplifier is connected to the second input of the second operational amplifier when none of the plurality of DAC cells are connected to a low reference voltage, the second input of the first transconductance amplifier being connected to the output of the first operational amplifier.

21. The digital to analog converter according to claim 13, wherein the respective reference voltage is a high or low voltage.

22. The digital to analog converter according to claim 13, wherein the digital to analog converter is segmented.

23. The digital to analog converter according to claim 13, wherein the digital to analog converter is binary weighted.

24. A digital to analog converter, comprising:
    a pair of operational amplifiers each coupled to a respective reference voltage at a first input thereof;
    a plurality of DAC cells, each coupled to an output and to a second input of the first operational amplifier by a first switch path and each coupled to an output and a second input of the second operational amplifier by a second switch path, each of the DAC cells coupled to a subsequent cell by a base resistance at the output of the cell; and
    a transconductance amplifier, having inputs coupled to a shorting switch through which input bias current of the first operational amplifier can flow and having an output to a respective one of the DAC cells.

25. The digital to analog converter according to claim 24, wherein the output of the transconductance amplifier is coupled to the respective DAC cell through an additional switch path.

26. The digital to analog converter according to claim 25, wherein the additional switch path of the transconductance amplifier is closed when none of the plurality of DAC cells in the voltage-mode DAC are connected to a high reference voltage.

27. The digital to analog converter according to claim 24, further comprising control logic that inputs a digital input code to activate at least one of the DAC cells.

28. The digital to analog converter according to claim 24, wherein each of the plurality of DAC cells contains two pairs of force and sense switches that are alternately closed when a control signal is applied to each of the DAC cells.

29. The digital to analog converter according to claim 28, wherein one of the pairs of switches is coupled to the inputs of the transconductance amplifier, the other pair of switches is coupled to the output and the second input of the second operational amplifier through the second switch path.

30. The digital to analog converter according to claim 29, wherein the other pair of switches are coupled to a termination cell.

31. The digital to analog converter according to claim 24, wherein the inputs of the transconductance amplifier are coupled to the output and the second input of the first operational amplifier.

32. The digital to analog converter according to claim 24, wherein the transconductance amplifier outputs a correction current to negate a biasing current to the first operational amplifier.

33. The digital to analog converter according to claim 24, wherein the output and the second input of the second operational amplifier are coupled to a termination cell.

34. The digital to analog converter according to claim 24, wherein the respective reference voltage is a high or low voltage.

35. The digital to analog converter according to claim 24, wherein the digital to analog converter has a R2R architecture.

36. A digital to analog converter, comprising:
a pair of operational amplifiers each coupled to a respective reference voltage at a first input thereof;
a plurality of DAC cells, each coupled to an output and to a second input of the first operational amplifier by a first switch path and each coupled to an output and a second input of the second operational amplifier by a second switch path; and
a transconductance amplifier, having a first input coupled to the output of an associated operational amplifier and a second input switchably coupled to the output and the second input of the associated operational amplifier, the transconductance amplifier having an output to a respective one of the DAC cells.

37. The digital to analog converter according to claim 36, wherein each of the plurality of DAC cells contains two pairs of force and sense switches that are alternately closed when a control signal is applied to each of the DAC cells.

38. The digital to analog converter according to claim 37, wherein one of the pairs of switches is coupled to the inputs of the transconductance amplifier, the other pair of switches is coupled to the output and the second input of the second operational amplifier through the second switch path.

39. The digital to analog converter according to claim 38, wherein the other pair of switches are coupled to a termination cell.

40. The digital to analog converter according to claim 36, further comprising control logic that inputs a digital input code to activate at least one of the DAC cells.

41. The digital to analog converter according to claim 36, further comprising a pair of shorting switches coupled to the output and the second input of the respective operational amplifier.

42. The digital to analog converter according to claim 36, wherein the transconductance amplifier outputs a correction current to negate a biasing current to the first operational amplifier.

43. The digital to analog converter according to claim 36, wherein the output and the second input of the second operational amplifier are coupled to a termination cell.

44. The digital to analog converter according to claim 36, wherein the second input of the transconductance amplifier is connected to the second input of the first operational amplifier when none of the plurality of DAC cells are connected to a high reference voltage.

45. The digital to analog converter according to claim 36, wherein the second input of the transconductance amplifier is connected to the output of the first operational amplifier when any of the DAC cells are connected to a low reference voltage.

46. The digital to analog converter according to claim 36, wherein the respective reference voltage is a high or low voltage.

47. The digital to analog converter according to claim 36, wherein the digital to analog converter has a R2R architecture.

48. A method of operating a digital to analog converter, comprising:
responsive to a digital input code, switching each of a plurality of DAC cells to one of a first operational amplifier and a second operational amplifier, the switched DAC cells providing respective contributions to an analog voltage generated at a common output of all the DAC cells;
generating a feedback voltage to the first operational amplifier based on the switching of the DAC cells;
generating a first correction current by a first transconductance amplifier based on a difference between an output voltage at the first operational amplifier and the feedback voltage to the first operational amplifier; and
feeding the first correction current to one of the DAC cells switched to the second operational amplifier when none of the DAC cells are switched to the first operational amplifier.

49. The method according to claim 48, further comprising:
generating a feedback voltage to the second operational amplifier based on the switching of the DAC cells;
generating a second correction current by a second transconductance amplifier based on a difference between an output voltage at the second operational amplifier and the feedback voltage to the second operational amplifier; and
feeding the second correction current to one of the DAC cells switched to the first operational amplifier when none of the DAC cells are switched to the second operational amplifier.

50. The method according to claim 49, wherein the second correction current is proportional to a gain and a voltage difference across the second transconductance amplifier.

51. The method according to claim 49, wherein the second correction current is output to one of the DAC cells switched to the first operational amplifier when none of the DAC cells are connected to a low reference voltage.

52. The method according to claim 48, wherein the first correction current is proportional to a gain and a voltage difference across the first transconductance amplifier.

53. The method according to claim 48, wherein the first correction current is output to one of the DAC cells switched to the second operational amplifier when none of the DAC cells are connected to a high reference voltage.

54. The method according to claim 48, wherein the digital to analog converter has a segmented architecture.

55. The method according to claim 48, wherein the digital to analog converter has a binary weighted architecture.

56. The method according to claim 48, wherein the digital to analog converter has a R2R architecture.

* * * * *